(12) United States Patent
Sanford et al.

(10) Patent No.: US 7,645,980 B2
(45) Date of Patent: Jan. 12, 2010

(54) PHOTOELECTRIC SWITCH HAVING A PRISM WITH A REFLECTIVE SURFACE BEING POSITIONED BY A RELEASE BUTTON

(75) Inventors: William C. Sanford, Mukilteo, WA (US); Henry V. Fletcher, Everett, WA (US); Trevor M. Laib, Woodinville, WA (US)

(73) Assignee: The Boeing Company, Chicago, IL (US)

( * ) Notice: Subject to any disclaimer, the term of this patent is extended or adjusted under 35 U.S.C. 154(b) by 25 days.

(21) Appl. No.: 11/655,632

(22) Filed: Jan. 19, 2007

(65) Prior Publication Data
US 2008/0173797 A1    Jul. 24, 2008

(51) Int. Cl.
*G01J 1/36* (2006.01)
(52) U.S. Cl. .............................. 250/227.22; 250/227.24
(58) Field of Classification Search .......... 250/214 SW, 250/221, 222.1, 227.21–227.24; 340/545.6, 340/545.1, 545.3; 200/61.93
See application file for complete search history.

(56) References Cited
U.S. PATENT DOCUMENTS

| | | | |
|---|---|---|---|
| 3,906,222 A * | 9/1975 | Astier et al. ................. 250/229 |
| 4,239,330 A | 12/1980 | Ashkin et al. | |
| 5,811,791 A * | 9/1998 | Portman ...................... 250/221 |
| 5,818,037 A * | 10/1998 | Redford et al. ............. 250/229 |
| 6,534,761 B2 * | 3/2003 | Fukatsu et al. ........... 250/222.1 |
| 6,800,839 B2 * | 10/2004 | Boehne ................ 250/214 PR |
| 6,884,986 B2 * | 4/2005 | Doczy et al. ............. 250/214 R |
| 6,989,526 B2 * | 1/2006 | Bohne et al. ................. 250/229 |
| 7,087,884 B2 * | 8/2006 | Fetzer et al. ................. 250/221 |
| 7,224,307 B2 * | 5/2007 | Hisatsune et al. ........... 341/176 |
| 7,375,613 B2 * | 5/2008 | Shelley et al. .............. 340/5.72 |
| 7,417,217 B2 * | 8/2008 | Deguchi et al. ............. 250/221 |
| 2006/0196874 A1 * | 9/2006 | Yang ........................... 220/211 |
| 2007/0060392 A1 * | 3/2007 | Sullivan ....................... 463/47 |
| 2007/0182551 A1 * | 8/2007 | Yang et al. ................ 340/545.3 |

* cited by examiner

*Primary Examiner*—Que T Le
(74) *Attorney, Agent, or Firm*—Tung & Associates

(57) ABSTRACT

A photoelectric switch is disclosed. An illustrative embodiment of the photoelectric switch includes at least one light source, a reflective surface provided in light-receiving relationship with respect to the at least one light source, a release button engaging the reflective surface and positional between first and second positions, a photocell provided in light-receiving relationship with respect to the reflective surface when the release button is disposed in the first position, a latch control circuit connected to the photocell and a latch connected to the latch control circuit. The light path incorporates a collimator to restrict operation of the system to the relationship of the light source and the retroreflector.

17 Claims, 6 Drawing Sheets

PHOTOELECTRIC SWITCH HAVING A PRISM WITH A REFLECTIVE SURFACE BEING POSITIONED BY A RELEASE BUTTON

FIELD

The present invention relates to switches. More particularly, the present invention relates to a photoelectric switch which is suitable for actuating a latch assembly on an overhead stow bin in an aircraft, for example.

BACKGROUND

A typical conventional switch mechanism for opening and closing overhead stow bins on aircraft includes a mechanical latch which is actuated by pressing a button on the stow bin. This action initiates a mechanical linkage that disengages latches provided on the lateral sides of the stow bin where the latches interface with the stow bin housing or structure. The linkage is housed inside a metal sheath provided on the interior surface of the stow bin door. The switch mechanism is heavy and vulnerable to significant wear during operation, leading to short life and damage from moving luggage.

SUMMARY

The present invention is generally directed to a photoelectric switch. An illustrative embodiment of the photoelectric switch includes at least one light source, a reflective surface provided in light-receiving relationship with respect to the at least one light source, a release button engaging the reflective surface and positional between first and second positions, a photocell provided in light-receiving relationship with respect to the reflective surface when the release button is disposed in the first position, a latch control circuit connected to the photocell and a latch connected to the latch control circuit.

BRIEF DESCRIPTION OF THE DRAWINGS

The invention will now be described, by way of example, with reference to the accompanying drawings, in which.

DETAILED DESCRIPTION

Figure 1:
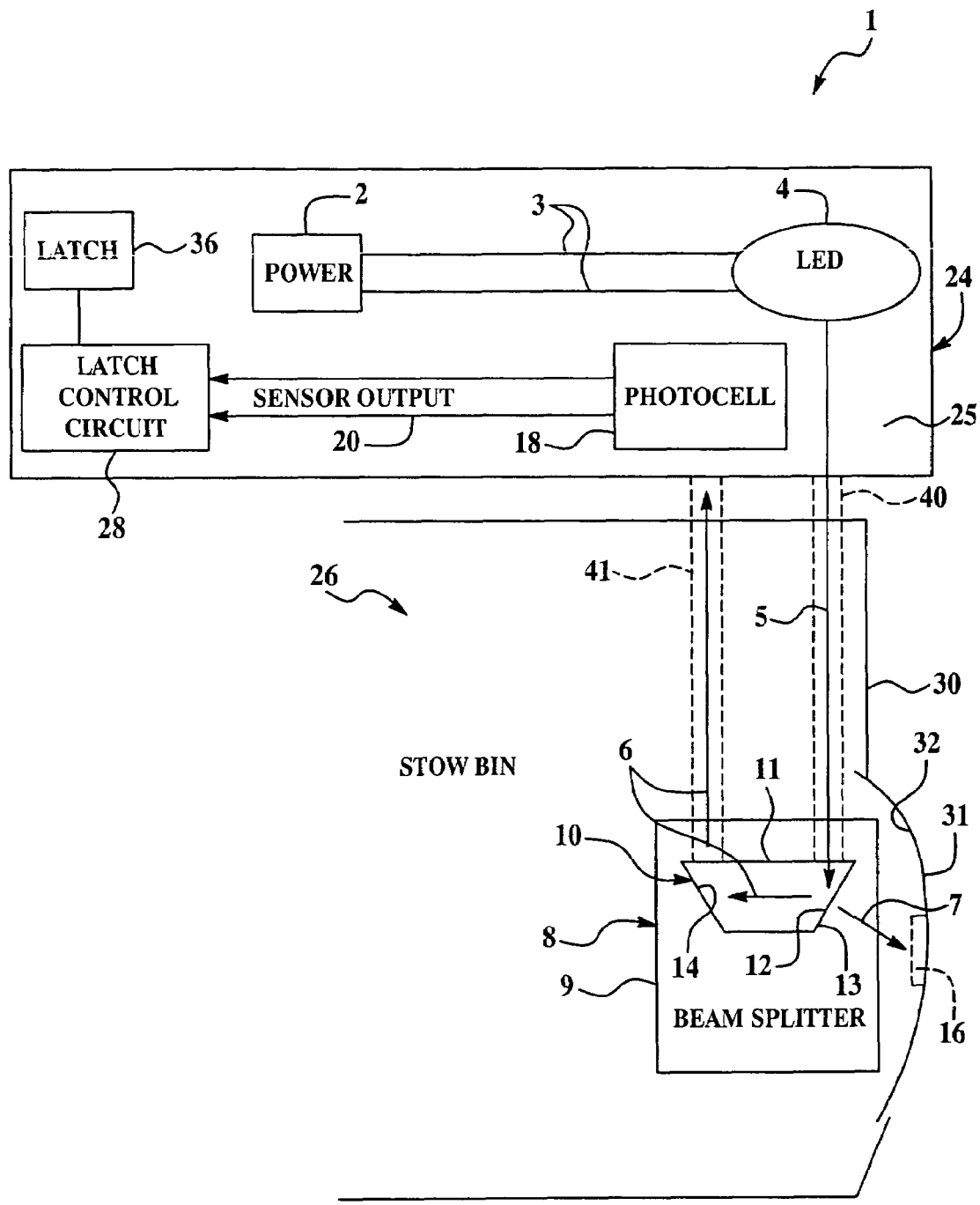
FIG. 1 is a schematic diagram illustrating an illustrative embodiment of the electronic switch, with a release button on a stow bin shown in a closed position.
Figure 2:
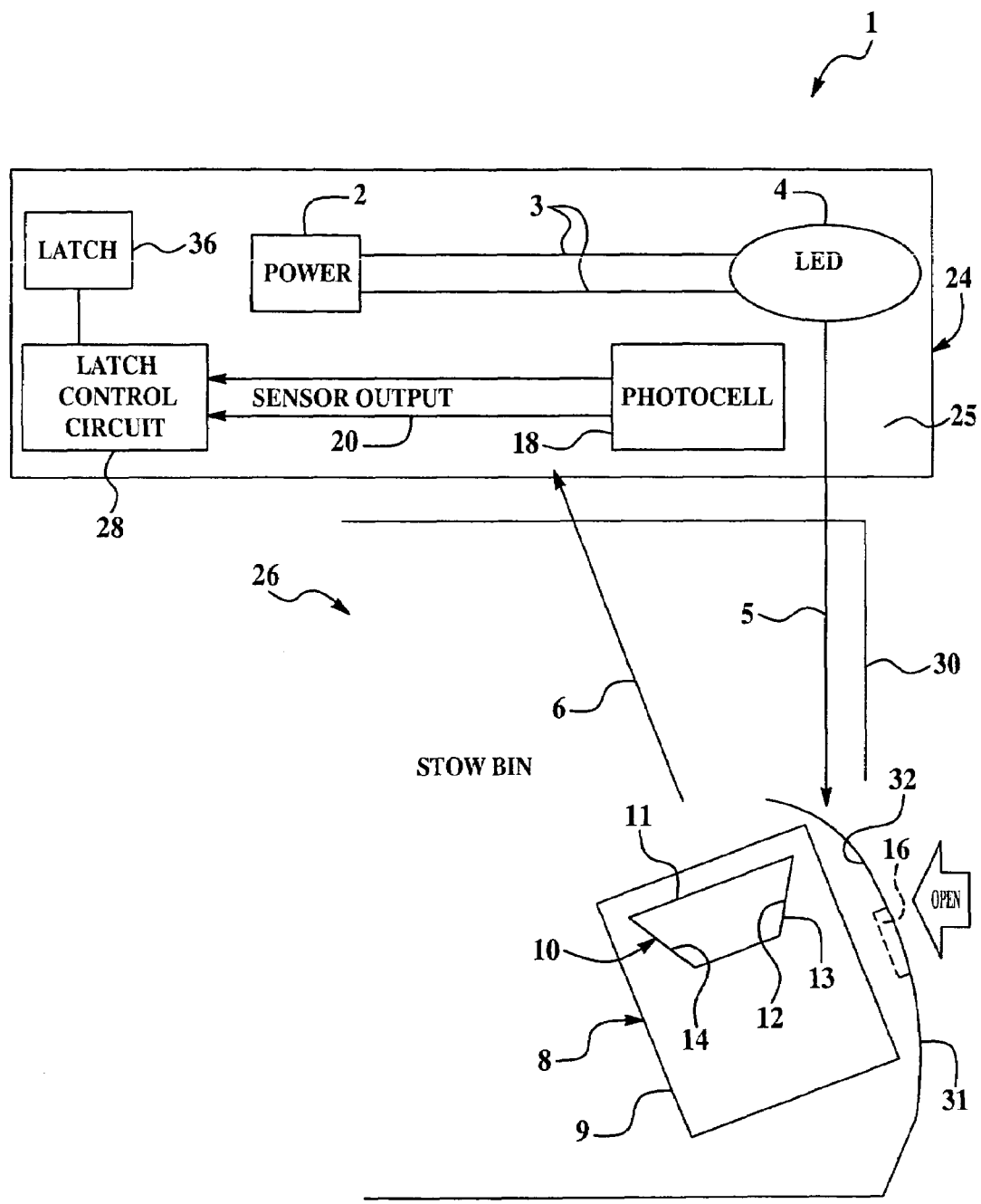
FIG. 2 is a schematic diagram illustrating an illustrative embodiment of the electronic switch shown in FIG. 1, with the release button on the stow bin shown in an open position.

Referring initially to FIGS. 1 and 2, an illustrative embodiment of the photoelectric switch is generally indicated by reference numeral 1. The photoelectric switch 1 will be hereinafter described with respect to an overhead stow bin 24 in a commercial aircraft. However, it is to be understood that the photoelectric switch 1 has numerous alternative applications. For purposes of illustration and description herein, the stow bin 24 includes a stow bin housing 25 having a stow bin interior 26. A pivoting stow bin door 30 is adapted to selectively open and close the stow bin interior 26. A release button 31 is provided on the stow bin door 30 and interfaces with at least one latch mechanism 36, which may be conventional. The release button 31 is pivotal between a closed position shown in FIG. 1, in which the at least one latch mechanism 36 latches the stow bin door 30, and an open position shown in FIG. 2, in which the at least one latch mechanism 36 unlatches the stow bin door 30.

The photoelectric switch 1 includes a power source 2 and at least one light source 4 which is connected to the power source 2 typically through power source wiring 3. In some embodiments, at least one light source 4 includes multiple light sources having various wavelengths. The power source 2 may be any source of electrical power which is suitable for powering the light source 4. In some embodiments of the photoelectric switch 1, the power source 2 includes at least one battery. In other embodiments of the photoelectric switch 1, the power source 2 includes the electrical power system of the aircraft. The light source 4 may be any type of light source which is suitable for emitting an incident light beam 5. In some embodiments of the photoelectric switch 1, the light source 4 is a light-emitting diode (LED). The light source 4 interfaces with the stow bin interior 26 of the stow bin 24. In some embodiments, the light source 4 is provided on an interior surface of a stow bin housing 25 of the stow bin 24.

A beam splitter 8 having a reflective surface is provided generally on or in engagement with the release button 31, in the stow bin interior 26. In some embodiments, the beam splitter 8 includes a beam splitter housing 9. A prism 10 is provided in the beam splitter housing 9. The prism 10 includes an incident light surface 11 which is disposed in light-receiving position with respect to the incident light beam 5 emitted from the light source 4. A beam splitting surface 12 is disposed at an angle with respect to the incident light surface 11. A beam exit surface 13 is on the exterior of the prism 10, opposite the beam splitting surface 12. A beam reflective surface 14 is disposed in, spaced-apart relationship with respect to the beam splitting surface 12. Upon pivoting of the release button 31 from the closed position shown in FIG. 1 to the open position shown in FIG. 2, the beam splitter 8 pivots with the release button 31. Accordingly, the incident light beam 5 enters the prism 10 through the incident light surface 11. The incident light beam 5 strikes the beam splitting surface 12, which splits the incident light beam 5 into a reflected light beam 6 and an exiting light beam 7. The reflected light beam 6 strikes the beam reflective surface 14 and exits the incident light surface 11. When the release button 31 is disposed in the closed position, the reflected light beam 6 exits the incident light surface 11 in generally parallel relationship with respect to the incident light beam 5, as shown in FIG. 1. When the release button 31 is disposed in the open position, the reflected light beam 6 is deflected away from the incident light beam 5, as shown in FIG. 2. In some embodiments of the photoelectric switch 1, a light filter 16 (shown in phantom) is provided on the release button 31 to facilitate a selected coloration of the release button 31 responsive to illumination by the exiting light beam 7. The filter 16 may be interchangeable with multiple filters 16 having various light-filtering and light-reflecting properties. The surface of the release button 31 on which the exiting light beam 7 impinges may have a phosphorescent coating 32 which remains illuminated when the stow bin door 30 is disposed in the open position. As shown in FIG. 1, in some embodiments, a light transmission pathway 40 (shown in phantom) extends from the light source 4 and/or a light transmission pathway 41 extends from the beam splitter 8 to transmit the incident light beam 5 and/or the reflected light beam 6, respectively. In some embodiments, the beam reflective surface 14 is a light-reflective surface such as a mirrored surface, for example, which is provided on the release button 31 and reflects the reflected light beam 6 to the photocell 18 when the release button 31 is disposed in the closed position shown in FIG. 1. In some embodiments, each of the light transmission pathway 40 and the light transmission pathway 41 is a fiber optic cable. In other embodiments, each of the light transmission pathway 40 and the light transmission pathway 41 is a collimator.

A photocell 18 having a photocell output 20 is provided in light-receiving relationship with respect to the reflected light beam 6 when the release button 31 is disposed in the closed position shown in FIG. 1. In some embodiments, the photocell 18 is disposed in generally adjacent relationship with respect to the light source 4, as shown in FIGS. 1 and 2. A latch control circuit 28 is connected to the photocell output 20 of the photocell 18. The latch control circuit 28 interfaces with at least one mechanical latch mechanism 36, which may be conventional. The at least one mechanical latch mechanism 36 interfaces with at least one latch receptacle (not shown) to selectively latch the stow bin door 30 with respect to the stow bin housing 25 of the stow bin 24, according to the knowledge of those skilled in the art. The latch control circuit 28 is adapted to selectively latch and unlatch the at least one mechanical latch mechanism 36 responsive to activation by the photocell 18, according to the knowledge of those skilled in the art.

In typical application of the photoelectric switch 1, the light source 4 emits the incident light beam 5 into the stow bin interior 26. When the stow bin door 30 and release button 31 are disposed in the closed position shown in FIG. 1, the incident light beam 5 enters the beam splitter housing 9 of the beam splitter 8 and the prism 10 through the incident light surface 11. The beam splitting surface 12 of the prism 10 splits the incident light beam 5 into the reflected light beam 6 and the exiting light beam 7. The reflected light beam 6 is reflected from the beam reflective surface 14 and exits the prism 10 through the incident light surface 11 and also exits the beam splitter housing 9, in generally parallel relationship with respect to the incident light beam 5. The photocell 18 receives the reflected light beam 6 and transmits a sensor output signal to the latch control circuit 28 through the photocell output 20. In turn, the latch control circuit 28 maintains the at least one mechanical latch 36 in the latched position to maintain the stow bin door 30 in the closed configuration on the stow bin housing 25. The exiting light beam 7 exits the prism 10 through the beam exit surface 13 and also exits the beam splitter housing 9, illuminating the release button 31.

Upon pivoting of the release button 31 from the closed position shown in FIG. 1 to the open position shown in FIG. 2, the beam splitter 8 pivots with the release button 31. Accordingly, the reflected light beam 6 is deflected away from the parallel path with respect to the incident light beam 5 (FIG. 1) and misses the photocell 18. The photocell 18 transmits a sensor output signal to the latch control circuit 28 through the photocell output 20. In turn, the latch control circuit 28 actuates the at least one mechanical latch 36 from the latched position to the unlatched position to unlatch the stow bin door 30 on the stow bin housing 25. The non-directed incident light beam 5 illuminates the stow bin interior 26 to enable sighting of contents (not shown) in the stow bin interior 26 while the stow bin door 30 is in the open position, as shown in FIG. 2.

Figure 3:
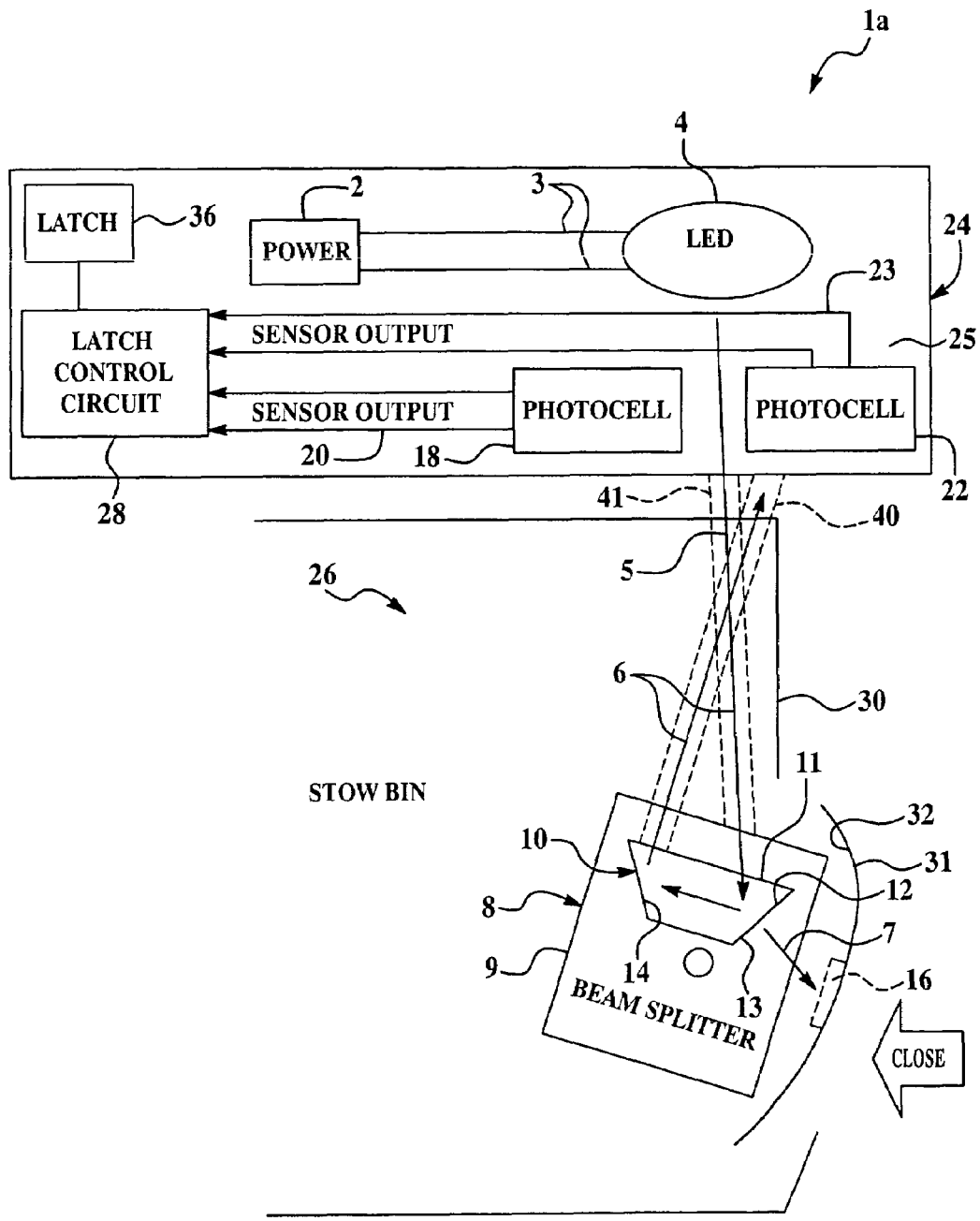
FIG. 3 is a schematic diagram illustrating an alternative illustrative embodiment of the electronic switch, with a release button on a stow bin shown in a closed position.
Figure 4:
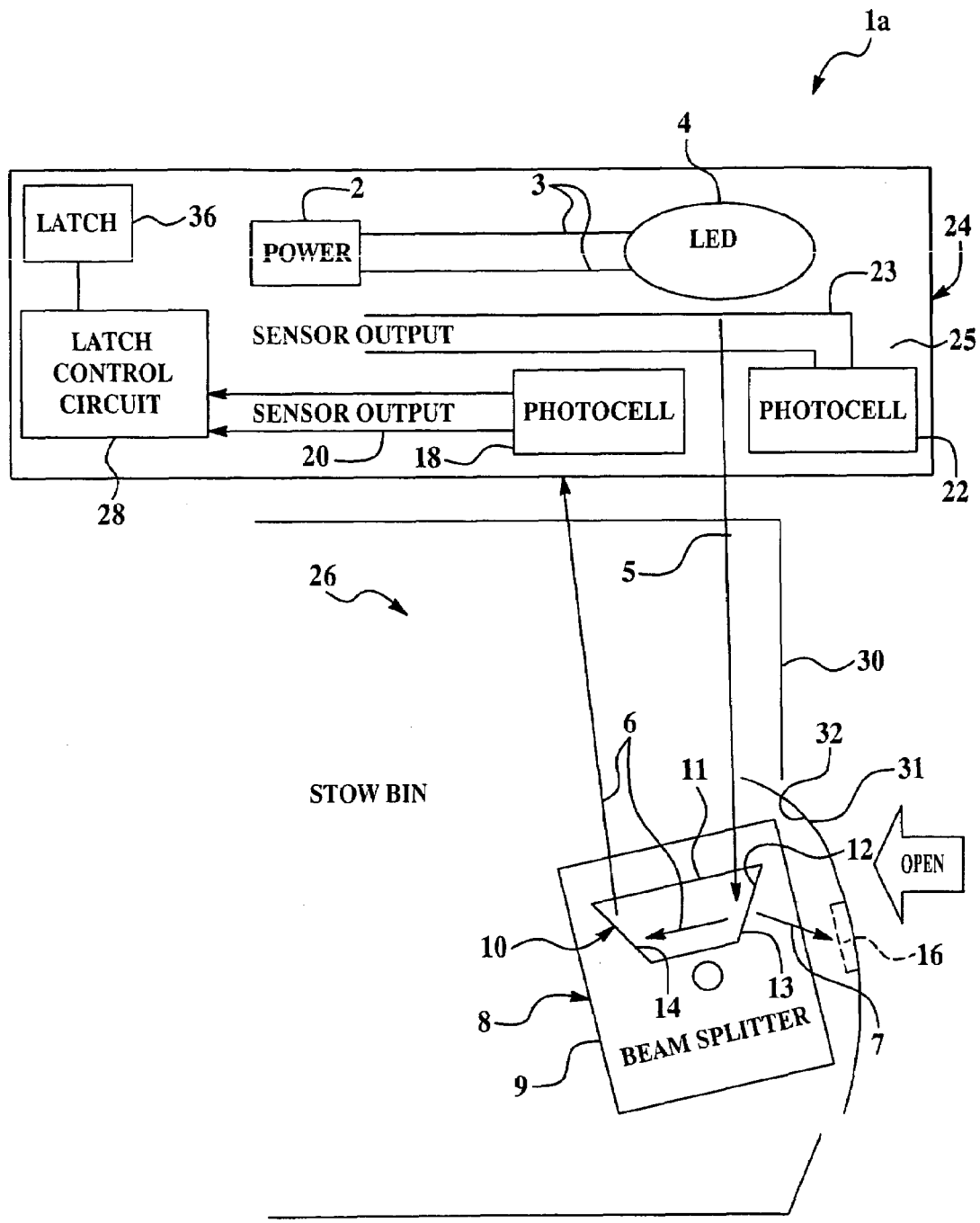
FIG. 4 is a schematic diagram illustrating the alternative illustrative embodiment of the electronic switch shown in FIG. 3, with the release button on a stow bin in an open position.

Referring next to FIGS. 3 and 4, an alternative illustrative embodiment of the photoelectric switch is generally indicated by reference numeral 1a. In the photoelectric switch 1a, a first photocell 18 and a second photocell 22 are each connected to the latch control circuit 28. When the stow bin door 30 and the release button 31 are disposed in the closed position shown in FIG. 3, the reflected light beam 6 impinges on the second photocell 22, which transmits a sensor output signal to the latch control circuit 28. In turn, the latch control circuit 28 closes and maintains the latch 36 in a closed or latched position. When the stow bin door 30 and the release button 31 are disposed in the open position shown in FIG. 4, the reflected light beam 6 impinges on the first photocell 18, which transmits a sensor output signal to the latch control circuit 28. In turn, the latch control circuit 28 opens or unlatches the latch 36. (This diagram does not show a change in the stowbin orientation—open vs. closed—there are changes in the relationship of the light source and the beam splitter in the two positions)

Figure 5:
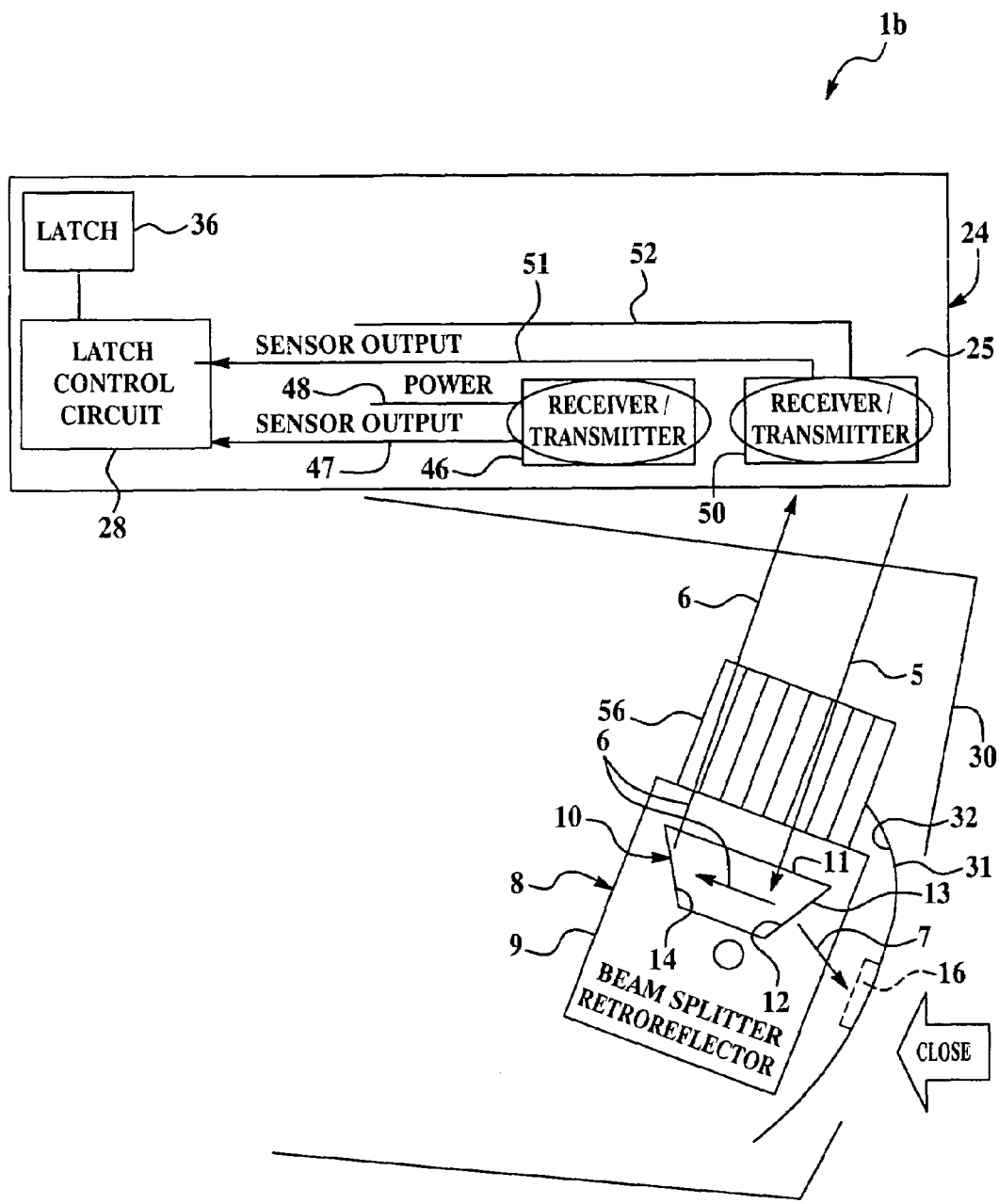
FIG. 5 is a schematic diagram illustrating an alternative illustrative embodiment of the electronic switch, with the release button on a stow bin shown in a closed position.
Figure 6:
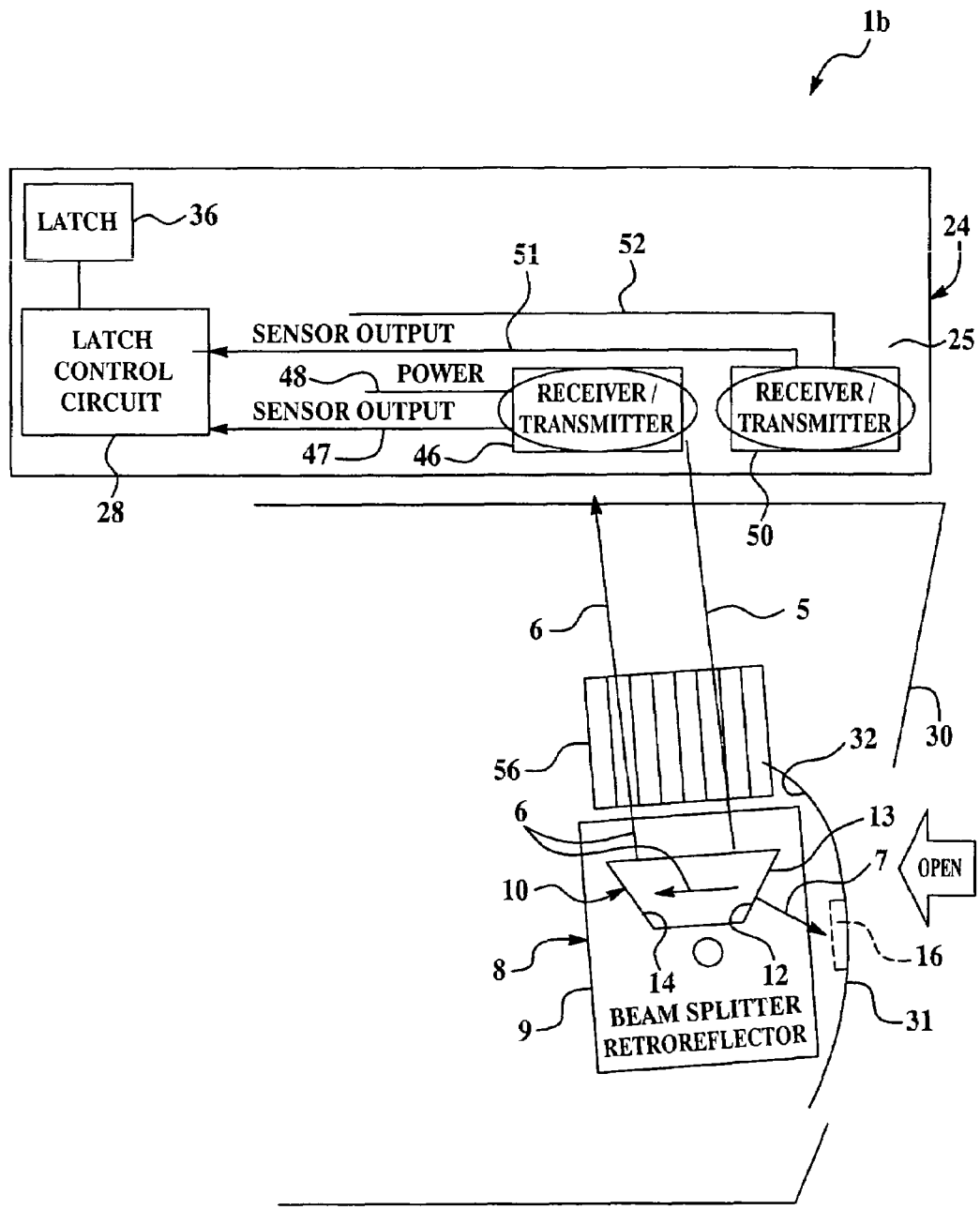
FIG. 6 is a schematic diagram illustrating the alternative illustrative embodiment of the electronic switch shown in FIG. 5, with the release button on the stow bin shown in an open position.

Referring next to FIGS. 5 and 6, another alternative embodiment of the photoelectric switch is generally indicated by reference numeral 1b. In the photoelectric switch 1b, a first receiver/transmitter 46 and a second receiver/transmitter 50 are each connected to the latch control circuit 28. A collimator 56 is provided between the first receiver/transmitter 46 and the beam splitter 8 and between the second receiver/transmitter 50 and the beam splitter 8. A first sensor output 47 connects the first receiver/transmitter 46 to the latch control circuit 28. A second sensor output 51 connects the second receiver/transmitter 50 to the latch control circuit 28. Power supplies 48 and 52 are connected to the first receiver/transmitter 46 and the second receiver/transmitter 50, respectively. The use of a collimator prevents ambient light from entering the light path, thus restricting the response to the light from the light source.

Each of the first receiver/transmitter 46 and the second receiver/transmitter 50 emits an incident light beam 5. When the stow bin door 30 and the release button 31 are disposed in the closed position shown in FIG. 5, the incident light beam 5 from the second receiver/transmitter 50 is emitted through the collimator 56 to the beam splitter 8. The reflected light beam 6 is emitted from the beam splitter 8 through the collimator 56 and impinges on the second receiver/transmitter 50, which transmits a sensor output signal through the second sensor output 51 to the latch control circuit 28. In turn, the latch control circuit 28 closes and maintains the latch 36 in a closed or latched position.

When the stow bin door 30 and the release button 31 are disposed in the open position shown in FIG. 6, the incident light beam 5 from the first receiver/transmitter 46 is emitted through the collimator 56 to the beam splitter 8. The reflected light beam 6 is emitted from the beam splitter 8 through the collimator 56 and impinges on the first receiver/transmitter 46, which transmits a sensor output signal through the first sensor output 47 to the latch control circuit 28. In turn, the latch control circuit 28 opens and maintains the latch 36 in an opened or unlatched position.

Although this invention has been described with respect to certain exemplary embodiments, it is to be understood that the specific embodiments are for purposes of illustration and not limitation, as other variations will occur to those of ordinary skill in the art.

What is claimed is:

1. A photoelectric switch, comprising:
   at least one light source;
   a reflective surface provided in light-receiving relationship with respect to said at least one light source;
   a prism that provides said reflective surface;
   a release button pivotally carried by a stow bin door and engaging said reflective surface, said reflective surface positional by said release button between first and second positions, said first and second positions respectively reflecting an incident light signal in different light reflective pathways from said reflective surface;
   a photocell provided in light-receiving relationship with respect to said reflective surface when said release button is disposed in said first position;
   a latch control circuit connected to said photocell; and
   a latch connected to said latch control circuit.

2. The photoelectric switch of claim 1 wherein said at least one light source comprises a light-emitting diode.

3. The photoelectric switch of claim 1 further comprising a collimator provided between said at least one light source and said reflective surface.

4. The photoelectric switch of claim 3 wherein said at least one light source comprises a light-emitting diode.

5. The photoelectric switch of claim 1 further comprising a second photocell provided in light-receiving relationship with respect to said reflective surface when said release button is disposed in said second position.

6. The photoelectric switch of claim 1 wherein said at least one light source comprises a plurality of sources of light having various wavelengths.

7. The photoelectric switch of claim 1 wherein said reflective surface comprises a mirrored surface.

8. The photoelectric switch of claim 1 further comprising a beam splitting surface provided in said prism.

9. The photoelectric switch of claim 8 further comprising a light filter provided on said release button.

10. The photoelectric switch of claim 9 further comprising multiple light filters interchangeable with said light filter.

11. The photoelectric switch of claim 1 further comprising a phosphorescent coating provided on said release button.

12. A photoelectric switch, comprising:
    a stow bin having a stow bin housing defining a stow bin interior;
    a stow bin door pivotal with respect to said stow bin housing;
    a first receiver/transmitter and a second receiver/transmitter provided on said stow bin housing;
    a reflective surface provided in light-receiving relationship with respect to said first receiver/transmitter and said second receiver/transmitter;
    a prism and wherein said reflective surface is provided in said prism;
    a release button pivotally carried by said stow bin door and engaging said reflective surface, said reflective surface positional by said release button between first and second positions, said first and second positions respectively reflecting an incident light signal in different light reflective pathways from said reflective surface;
    wherein said first receiver/transmitter is provided in light-receiving relationship with respect to said reflective surface when said release button is disposed in said first position;
    wherein said second receiver/transmitter is provided in light-receiving relationship with respect to said reflective surface when said release button is disposed in said second position;
    a latch control circuit connected to said first receiver/transmitter and said second receiver/transmitter; and
    a latch connected to said latch control circuit.

13. The photoelectric switch of claim 12 further comprising a collimator provided between said reflective surface and said first receiver/transmitter and said second receiver/transmitter.

14. The photoelectric switch of claim 12 further comprising a beam splitting surface provided in said prism.

15. A photoelectric switch, comprising:
    a stow bin having a stow bin housing defining a stow bin interior;
    a stow bin door pivotal with respect to said stow bin housing;
    at least one light source;
    a reflective surface provided in light-receiving relationship with respect to said at least one light source;
    a prism and wherein said reflective surface is provided in said prism;
    a release button pivotally carried by said stow bin door and engaging said reflective surface, said reflective surface positional by said release button between first and second positions, said first and second positions respectively reflecting an incident light signal in different light reflective pathways from said reflective surface;
    a photocell provided in light-receiving relationship with respect to said reflective surface when said release button is disposed in said first position;
    a latch control circuit connected to said photocell;
    a latch connected to said latch control circuit; and
    wherein said at least one light source is adapted to illuminate said stow bin interior when said release button is disposed in said second position.

16. The photoelectric switch of claim 15 wherein said reflective surface comprises a mirrored surface.

17. The photoelectric switch of claim 15 further comprising a beam splitting surface provided in said prism.

* * * * *